United States Patent
Cho et al.

(10) Patent No.: US 10,659,092 B2
(45) Date of Patent: May 19, 2020

(54) CHANNEL LOSS COMPENSATION CIRCUITS

(71) Applicant: TAIWAN SEMICONDUCTOR MANUFACTURING COMPANY, LTD., Hsinchu (TW)

(72) Inventors: Lan-Chou Cho, Hsinchu (TW); Chewn-Pu Jou, Hsinchu (TW); Feng Wei Kuo, Zhudong Township (TW); Huan-Neng Chen, Taichung (TW); William Wu Shen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/399,811

(22) Filed: Apr. 30, 2019

(65) Prior Publication Data
US 2019/0260407 A1 Aug. 22, 2019

Related U.S. Application Data

(60) Division of application No. 15/377,283, filed on Dec. 13, 2016, now Pat. No. 10,298,277, which is a continuation of application No. 14/954,003, filed on Nov. 30, 2015, now Pat. No. 9,543,993.

(51) Int. Cl.
| | |
|---|---|
| *H04B 1/10* | (2006.01) |
| *H04B 1/04* | (2006.01) |
| *H04L 25/02* | (2006.01) |
| *H01L 23/66* | (2006.01) |
| *H04L 25/03* | (2006.01) |

(52) U.S. Cl.
CPC .......... *H04B 1/1027* (2013.01); *H01L 23/66* (2013.01); *H04B 1/0475* (2013.01); *H04B 1/0483* (2013.01); *H04L 25/028* (2013.01); *H04L 25/03* (2013.01); *H01L 2223/6666* (2013.01); *H04B 2001/0416* (2013.01); *H04L 25/0292* (2013.01); *H04L 25/03878* (2013.01)

(58) Field of Classification Search
CPC .. H04B 1/1027; H04B 1/0483; H04B 1/0475; H04B 2001/0416; H04L 25/03; H04L 25/028; H04L 25/0292; H04L 25/03878; H01L 23/66
See application file for complete search history.

(56) References Cited

U.S. PATENT DOCUMENTS

| | | | | |
|---|---|---|---|---|
| 6,006,111 A * | 12/1999 | Rowland | ................. | H03F 3/602 330/124 R |
| 6,054,896 A * | 4/2000 | Wright | ................. | H03F 1/3247 330/149 |
| 6,075,823 A * | 6/2000 | Sonoda | ................ | H04B 7/0851 375/214 |
| 6,351,473 B1 * | 2/2002 | Reusens | .................... | H04L 1/04 370/480 |

(Continued)

*Primary Examiner* — Bobbak Safaipour
(74) *Attorney, Agent, or Firm* — Hauptman Ham, LLP

(57) ABSTRACT

A receiver circuit includes a plurality of receivers, each of the receivers being associated with a carrier of a plurality of carriers, and a decoupler configured to receive a transmission signal from a transmission channel and output a plurality of divided transmission signals to the plurality of receivers. An equalizer is configured to modify either the transmission signal or one of the divided transmission signals.

20 Claims, 12 Drawing Sheets

(56) References Cited

U.S. PATENT DOCUMENTS

| | | | |
|---|---|---|---|
| 7,058,381 B2* | 6/2006 | Schmidt | H04B 1/30 375/233 |
| 8,134,224 B2 | 3/2012 | Sagae | |
| 8,279,008 B2 | 10/2012 | Hsieh et al. | |
| 8,427,240 B2 | 4/2013 | Hsieh et al. | |
| 8,488,610 B2* | 7/2013 | Medapalli | H04L 1/1887 370/229 |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,805,297 B2* | 8/2014 | Hanevich | H04B 1/001 455/73 |
| 8,981,869 B2 | 3/2015 | Puzella | |
| 9,543,993 B1* | 1/2017 | Cho | H04B 1/0483 |
| 9,628,261 B1* | 4/2017 | Kuo | H04L 7/0331 |
| 10,298,277 B2* | 5/2019 | Cho | H01L 23/66 |
| 2002/0060990 A1* | 5/2002 | Bohnke | H04B 7/0613 370/270 |
| 2003/0058787 A1* | 3/2003 | Vandenameele-Lepla | H04L 25/0202 370/206 |
| 2004/0123175 A1* | 6/2004 | Roth | G06F 5/08 713/401 |
| 2005/0074074 A1* | 4/2005 | Limberg | H04L 1/0054 375/285 |
| 2005/0210244 A1* | 9/2005 | Stevens | H04B 1/707 713/166 |
| 2007/0184794 A1* | 8/2007 | Drogi | H03F 1/0205 455/127.1 |
| 2010/0033262 A1 | 2/2010 | Puzella | |
| 2010/0126010 A1 | 5/2010 | Puzella | |
| 2010/0195755 A1* | 8/2010 | Shapiro | H04L 27/2608 375/285 |
| 2012/0092230 A1 | 4/2012 | Hung et al. | |
| 2013/0057328 A1* | 3/2013 | Xu | H03D 13/004 327/157 |
| 2013/0234305 A1 | 9/2013 | Lin et al. | |
| 2014/0044157 A1* | 2/2014 | Chang | G11C 5/063 375/219 |
| 2014/0132333 A1 | 5/2014 | Jin et al. | |
| 2014/0217546 A1 | 8/2014 | Yen et al. | |
| 2014/0253262 A1 | 9/2014 | Hsieh et al. | |
| 2014/0253391 A1 | 9/2014 | Yen | |
| 2015/0036728 A1* | 2/2015 | Nguyen | H04L 1/06 375/222 |
| 2015/0063426 A1* | 3/2015 | Krasner | G01S 5/145 375/142 |
| 2017/0033870 A1* | 2/2017 | Dangui | H04J 14/0279 |
| 2017/0117932 A1* | 4/2017 | Chen | H04W 52/0261 |
| 2017/0126462 A1* | 5/2017 | Hsueh | H04L 1/0001 |
| 2017/0150429 A1* | 5/2017 | Baldemair | H04B 7/06 |
| 2017/0155412 A1* | 6/2017 | Cho | H04L 25/03 |

* cited by examiner

CHANNEL LOSS COMPENSATION CIRCUITS

PRIORITY CLAIM

The present application is a divisional of U.S. application Ser. No. 15/377,283, filed Dec. 13, 2016, which is a continuation of U.S. application Ser. No. 14/954,003, filed Nov. 30, 2015, now U.S. Pat. No. 9,543,993, issued Jan. 10, 2017, each of which is incorporated herein by reference in its entirety.

BACKGROUND

Radio frequency interconnects (RFIs) are sometimes included in an integrated circuit for communicating data between components of the integrated circuit. RFIs include transmitters that communicate data to receivers via a plurality of transmission channels. To transmit the data, the transmitters modulate the data to be transmitted using a plurality of carriers. The modulated data is transmitted to the receivers. To receive the data, the receivers demodulate received signals from the carriers. Each transmission channel has a frequency response, which causes channel loss. For example, five carriers that each have a different frequency have different channel losses. Channel loss degrades the quality of the transmitted data.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
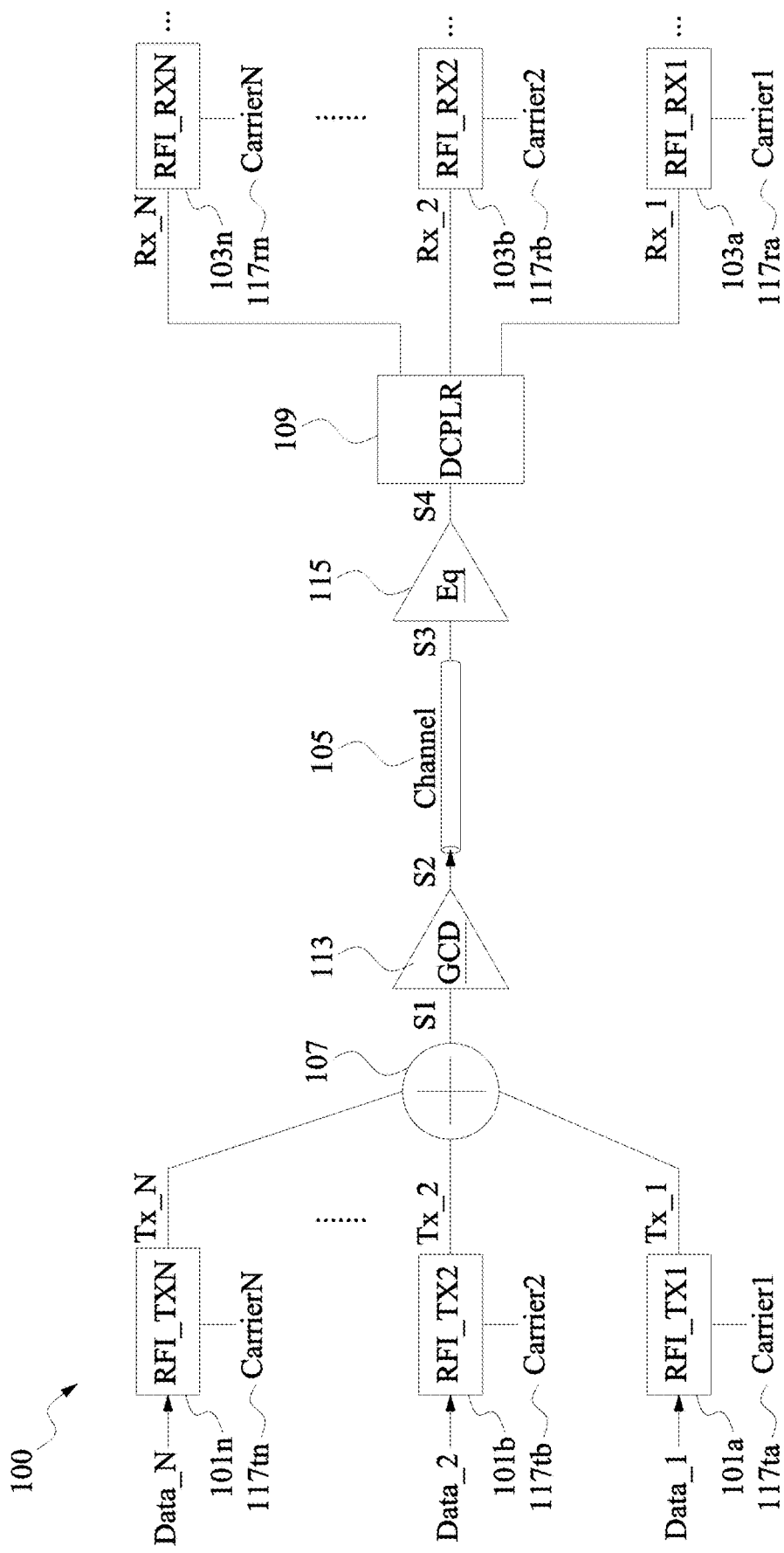
FIG. 1 is a block diagram of a radio frequency interconnect, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

RFIs include transmitters that communicate data to receivers using a plurality of carriers. Each transmission channel by which data is communicated to the receivers has a frequency response, which causes channel loss. Channel loss degrades the quality of the transmitted data, and introduces noise to the transmission. The noise introduced has a negative effect on a signal-to-noise ratio that affects the quality of a transmitted signal and the performance of an RFI and increases a risk of errors in decoding the received data.

FIG. 1 is a block diagram of an RFI 100, in accordance with one or more embodiments. RFI 100 comprises a plurality of transmitters 101a-101n (collectively referred to as transmitters 101) configured to transmit data Data_1-Data_N (collectively referred to as transmission data) to a plurality of receivers 103a-103n (collectively referred to as receiver(s) 103) by way of a transmission channel 105. RFI 100 includes a combiner 107 on a transmitter-side of the transmission channel 105 and a decoupler 109 on a receiver-side of the transmission channel 105. The combiner 107 is communicatively coupled with the transmitters 101 and the transmission channel 105. The decoupler 109 is communicatively coupled with the receivers 103 and the transmission channel 105. A gain compensation driver 113 is communicatively coupled between the combiner 107 and the transmission channel 105. The transmitters 101 are communicatively coupled with the transmission channel 105 by way of the gain compensation driver 113 and the combiner 107. An equalizer 115 is communicatively coupled between the decoupler 109 and the transmission channel 105. The receivers 103 are communicatively coupled with the transmission channel 105 by way of the equalizer 115 and the decoupler 109.

The transmitters 101 are each associated with a transmission carrier 117ta-117tn and the receivers 103 are each associated with a reception carrier 117ra-117rn (transmission carriers and reception carriers are collectively referred to as carriers 117). Carriers 117 are, for example, carrier signals or carrier waves, generated by one or more carrier generators (not shown). Transmission carriers 117ta-117tn have frequencies that correspond to respective reception carriers 117ra-117rn. The carriers 117 are modulated by the corresponding transmitters 101 to communicate the transmission data to the receivers 103 as a transmission signal. Each transmitter 101 receives respective transmission data Data_1-Data_N and outputs a corresponding transmission signal Tx_1-Tx_N (collectively referred to as transmission signals Tx). The receivers 103 use the receiving carriers 117 to demodulate received transmission signals Rx_1-Rx_N (collectively referred to as received transmission signals Rx) to recover the transmission data. The demodulated transmission data is read by the receivers 103 or output by the receivers 103 to a device capable of reading the demodulated transmission data.

The combiner 107 is configured to receive the transmission signals Tx from the transmitters 101, to combine the transmissions signals Tx, and to output a combined transmission signal S1. Signal S1 is communicated to the decoupler 109 by way of the transmission channel 105. The transmission channel 105 is a single channel transmission line or medium. In some embodiments, transmission channel 105 is a dual-channel transmission line or medium. In some embodiments, transmission channel 105 is a multi-channel transmission line or medium. In some embodiments, a quantity of channels included in the multi-channel transmission line or medium is less than a quantity of carriers 117.

The transmission channel 105 has a frequency response that causes carriers 117 to have different amounts of channel loss, which affects the amplitude of the received transmission signals Rx. Channel loss reduces a strength of transmission signals Tx and/or signal S1. The channel loss degrades signal-to-noise ratio performance, which negatively affects the quality and/or speed of the received transmission signals Rx corresponding to the transmission signals Tx and/or signal S1. If the quality of the received transmission signals Rx are degraded, then the transmission data recovered therefrom, is degraded. If the speed with which the transmission signals Tx and/or signal S1 propagating through transmission channel 105 is negatively affected, an amount of time taken to recover the transmission data from the received transmission signal Rx is increased, which increases processing times and introduces delay. RFI 100, accordingly, includes gain compensation driver 113 and/or equalizer 115 to compensate for the channel loss and shape the frequency response.

Gain compensation driver 113 is a channel loss compensation circuit configured to receive signal S1 and to output a signal S2 to the transmission channel 105. Signal S2 is a modified signal S1 to compensate for the channel loss introduced by transmission channel 105. The gain compensation driver 113 is configured to generate signal S2 by delaying signal S1 by a delay factor $T_{gcdb}$, amplifying the delayed signal by a gain factor $\alpha_{gcd1}$, and adding the amplified delayed signal to signal S1. In some embodiments, the channel loss compensated for by the gain compensation driver 113 is an estimated channel loss, because signal S2 has not yet been transmitted through the transmission channel 105 before signal S1 is received by the gain compensation driver 113. In some embodiments, the channel loss compensated for by the gain compensation driver 113 is based on measured results from passing signals through the transmission channel 105. In some embodiments, gain factor $\alpha_{gcd1}$ is capable of being modified to change the amount the delayed signal is amplified to compensate for different amounts of channel loss.

Signal S2 output by gain compensation driver 113 is transmitted through transmission channel 105 to receivers 103. En route to receivers 103, transmission channel 105 causes channel loss to signal S2 propagating through the transmission channel 105. Signal S3 is output from transmission channel 105. Signal S3 corresponds to signal S2 following the channel loss in the transmission channel 105. In some embodiments, gain factor $\alpha_{gcd1}$ is set at a selected value such that signal S3 is equal to signal S1 or within a predefined signal-to-noise ratio threshold of signal S1 after the channel loss is introduced to signal S2 by transmission channel 105.

Equalizer 115 is a channel loss compensation circuit configured to receive signal S3 and to output a signal S4 to the decoupler 109. Signal S3 is modified by equalizer 115 to compensate for the channel loss introduced by transmission channel 105 and/or excess gain introduced to signal S2 remaining after transmission of signal S2 through transmission channel 105. The equalizer 115 is configured to generate signal S4 by delaying signal S3 by a delay factor $T_{eqb}$, amplifying the delayed signal by a gain factor $\alpha_{eq1}$, and adding the amplified delayed signal to signal S3. In some embodiments, gain factor $\alpha_{eq1}$ is capable of being modified to change the amount the delayed signal is amplified. Changing gain factor $\alpha_{eq1}$ affects an amount of channel loss the equalizer 115 is configured to compensate. In some embodiments, gain factor $\alpha_{eq1}$ is set at a selected value such that signal S4 is equal to signal S1 or within a predefined signal-to-noise ratio threshold of signal S1 after the gain compensation driver 113 compensates for the channel loss introduced by transmission channel 105 and/or channel loss is introduced to signal S2 by transmission channel 105.

In some embodiments, RFI 100 is free from a gain compensation driver 113. If gain compensation driver 113 is absent from RFI 100, signal S3 received by equalizer 115 is signal S1 (i.e., the combined transmission signals Tx without gain compensation) after signal S1 is transmitted through transmission channel 105.

In some embodiments, RFI 100 is free from including an equalizer 115. If equalizer 115 is absent from RFI 100, signal S3 output by transmission channel 105 is communicated directly to decoupler 109.

Decoupler 109 is configured to receive signal S4. In some embodiments, if the equalizer 115 is absent from RFI 100, then decoupler 109 is configured to receive signal S3. Decoupler 109 is configured to divide a received signal (i.e., signal S4 or signal S3) into received transmission signals Rx, and to communicate the received transmission signals Rx to the respective receivers 103. For example, transmission data Data_1 transmitted by transmitter 101a as transmission signal Tx_1 is communicated to receiver 103a and received by receiver 103a as received transmission signal Rx_1, transmission data Data_2 transmitted by transmitter 101b as transmission signal Tx_2 is communicated to receiver 103b and received by receiver 103b as received transmission signal Rx_2, and transmission data Data_N transmitted by transmitter 101n as transmission signal Tx_N is communicated to receiver 103n and received by receiver 103n as received transmission signal Rx_N.

In some embodiments, RFI 100 is included in an integrated circuit. In some embodiments, RFI 100 is an on-chip interconnect. In some embodiments, RFI 100 is over or at least partially within a substrate. In some embodiments, the components of RFI 100 are divided among two or more integrated circuits or separate substrates. In some embodiments, transmission channel 105 is one or more of a wired or a wireless communication channel.

Figure 2:
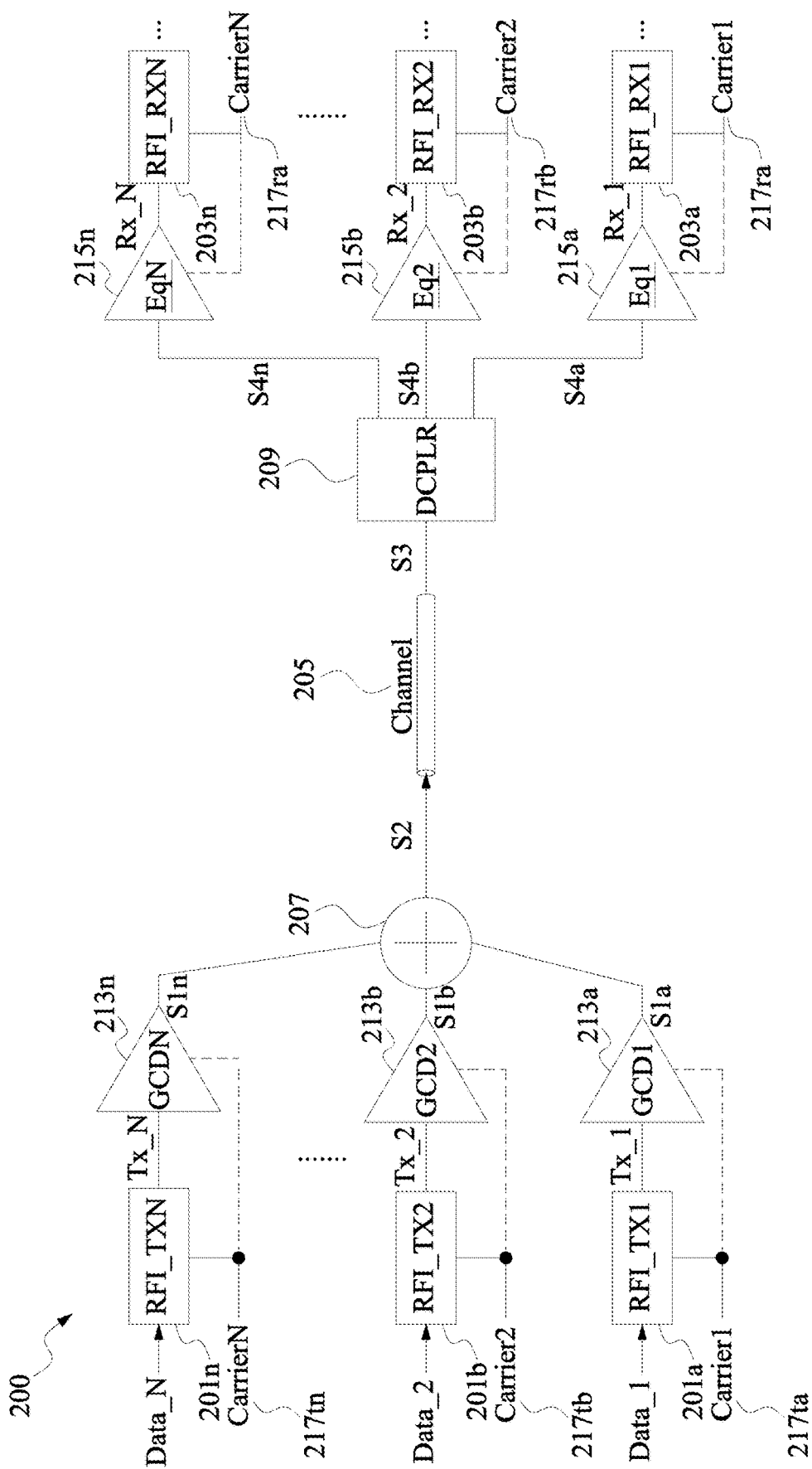
FIG. 2 is a block diagram of a radio frequency interconnect, in accordance with one or more embodiments.

FIG. 2 is a block diagram of an RFI 200, in accordance with one or more embodiments. RFI 200 comprises many of the features discussed with respect to RFI 100 (FIG. 1), with the reference numerals increased by 100. RFI 200 differs from RFI 100 in that RFI 200 includes a plurality of gain compensation drivers 213a-213n (collectively referred to as gain compensation drivers 213) and a plurality of equalizers 215a-215n (collectively referred to as equalizers 215). The gain compensation drivers 213 are each individually communicatively coupled with respective transmitters 201 and with the combiner 207 on the transmitter-side of the combiner 207. The equalizers 215 are each individually communicatively coupled with respective receivers 203 and with the decoupler 209 on the receiver-side of the decoupler 209. In some embodiments, combiner 207 and decoupler 209 are each directly coupled with transmission channel 205. In some embodiments, at least one intervening device is located between the combiner 207 and the transmission channel 205 or between the decoupler 209 and the transmission channel 205. Gain compensation drivers 213 are coupled with the transmission channel 205 by way of the combiner 207. Equalizers 215 are coupled with the transmission channel 205 by way of decoupler 209.

In RFI 200, each gain compensation driver 213a-213n receives respective transmission signal Tx_1-Tx_N from the transmitters 101. The gain compensation drivers 213 are optionally configured to receive carriers 217. The gain compensation drivers 213 are configured to modify the transmission signals Tx to compensate for channel loss and output signals S1a-S1n to combiner 207. In some embodiments, gain compensation drivers 213 use the carriers 217 to modify transmission signals Tx to generate signals S1a-S1n.

Gain compensation drivers 213 are configured to generate signals S1a-S1n by delaying signals S1a-S1n by respective delay factors $T_{gcdb1}$-$T_{gcdbn}$, amplifying the delayed signals by respective gain factors $\alpha_{gcd1}$-$\alpha_{gcdn}$, and adding the amplified delayed signals to the respective transmission signals Tx. In some embodiments, the channel loss compensated for by the gain compensation drivers 213 is an estimated channel loss, because signal S2 has not yet been transmitted through the transmission channel 205 before transmission signals Tx are received by the gain compensation drivers 213. In some embodiments, gain factors $\alpha_{gcd1}$-$\alpha_{gcdn}$ are capable of being modified to change the amount the delayed signal is amplified. Changing one or more of gain factors $\alpha_{gcd1}$-$\alpha_{gcdn}$ affects an amount of channel loss for which the gain compensation drivers 213 are configured to compensate. In some embodiments, delay factors $T_{gcdb1}$-$T_{gcdbn}$ are equal. In some embodiments, delay factors $T_{gcdb1}$-$T_{gcdbn}$ are not equal. In some embodiments, delay factors $T_{gcdb1}$-$T_{gcdbn}$ are based on the carriers 217. In some embodiments, gain factors $\alpha_{gcd1}$-$\alpha_{gcdn}$ are equal. In some embodiments, gain factors $\alpha_{gcd1}$-$\alpha_{gcdn}$n are not equal. In some embodiments, gain factors $\alpha_{gcd1}$-$\alpha_{gcdn}$ are based on the carriers 217.

Combiner 207 is configured to combine signals S1a-S1n and to output signal S2. Signal S2 output by combiner 207 is transmitted through transmission channel 205 to receivers 203. En route to receivers 203, transmission channel 205 introduces channel loss to signal S2. Signal S3 is output from transmission channel 205. Signal S3 corresponds to signal S2 after the channel loss is introduced to signal S2 by transmission channel 205.

Decoupler 209 is configured to receive signal S3 and to divide signal S3 into signals S4a-S4n (collectively referred to as signals S4). Signals S4 are communicated to respective equalizers 215 for conversion to received transmission signals Rx that are communicated to the respective receivers 203.

Equalizers 215 are configured receive signals S4 and to output received transmissions signals Rx_1-Rx_N to receivers 203. Signals S4 are modified by equalizers 215 to compensate for the channel loss introduced by transmission channel 205 and/or excess gain introduced to signals S1 remaining after transmission of signal S2 through transmission channel 205. Equalizers 215 are configured to generate received transmission signals Rx_1-Rx_N by delaying signals Rx_1-Rx_N by respective delay factors $T_{eqb1}$-$T_{eqbn}$, amplifying the delayed signals by a respective gain factor $\alpha_{eq1}$-$\alpha_{eqn}$, and adding the amplified delayed signals to the respective signals S4. In some embodiments, gain factors $\alpha_{eq1}$-$\alpha_{eqn}$ are capable of being modified to change the amount the delayed signal is amplified. Changing one or more of gain factors $\alpha_{eq1}$-$\alpha_{eqn}$ affects an amount of channel loss for which the equalizers 215 are configured to compensate. In some embodiments, delay factors $T_{eqb1}$-$T_{eqbn}$ are equal. In some embodiments, delay factors $T_{eqb1}$-$T_{eqbn}$ are not equal. In some embodiments, delay factors $T_{eqb1}$-$T_{eqbn}$ are based on the carriers 217. In some embodiments, gain factors $\alpha_{eq1}$-$\alpha_{eqn}$ are equal. In some embodiments, gain factors $\alpha_{eq1}$-$\alpha_{eqn}$ are not equal. In some embodiments, gain factors $\alpha_{eq1}$-$\alpha_{eqn}$ are based on the carriers 217. In some embodiments, gain factors $\alpha_{eq1}$-$\alpha_{eqn}$ are set at selected values such that received transmissions signals Rx_1-Rx-N are equal to transmission signals Tx_1-Tx_N, or within a predefined signal-to-noise ratio threshold of transmission signals Tx_1-Tx_N after the channel loss is introduced to signal S2 by transmission channel 205.

Figure 3:
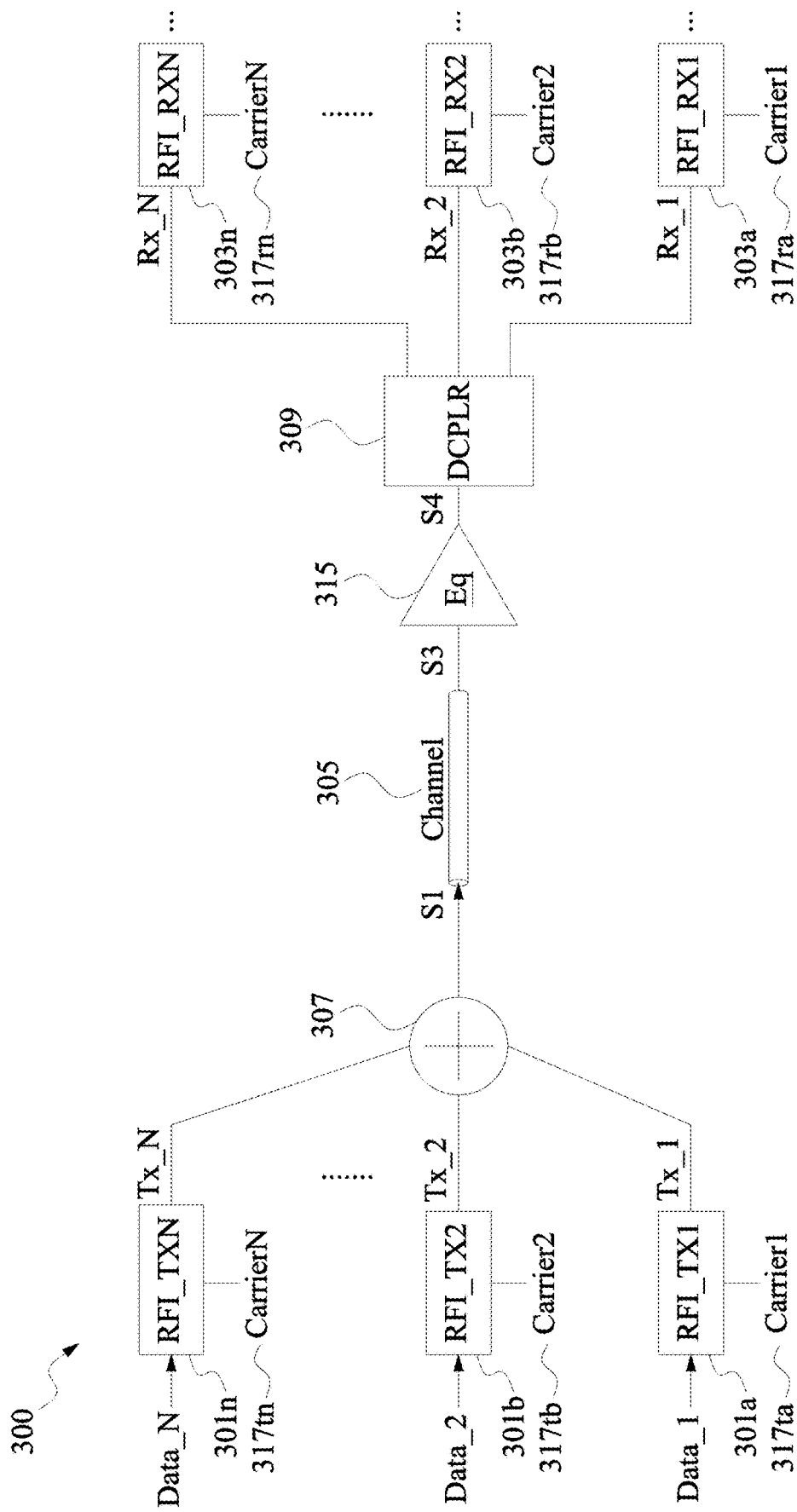
FIG. 3 is a block diagram of a radio frequency interconnect, in accordance with one or more embodiments.

FIG. 3 is a block diagram of an RFI 300, in accordance with one or more embodiments. RFI 300 comprises many of the features discussed with respect to RFI 100 (FIG. 1), with the reference numerals increased by 200. RFI 300 differs from RFI 100 in that RFI 300 is free from including gain compensation driver 113 (FIG. 1). Signal S1 is transmitted through transmission channel 305. Transmission channel 305 introduces channel loss to signal S1 and outputs signal S3.

Figure 4:
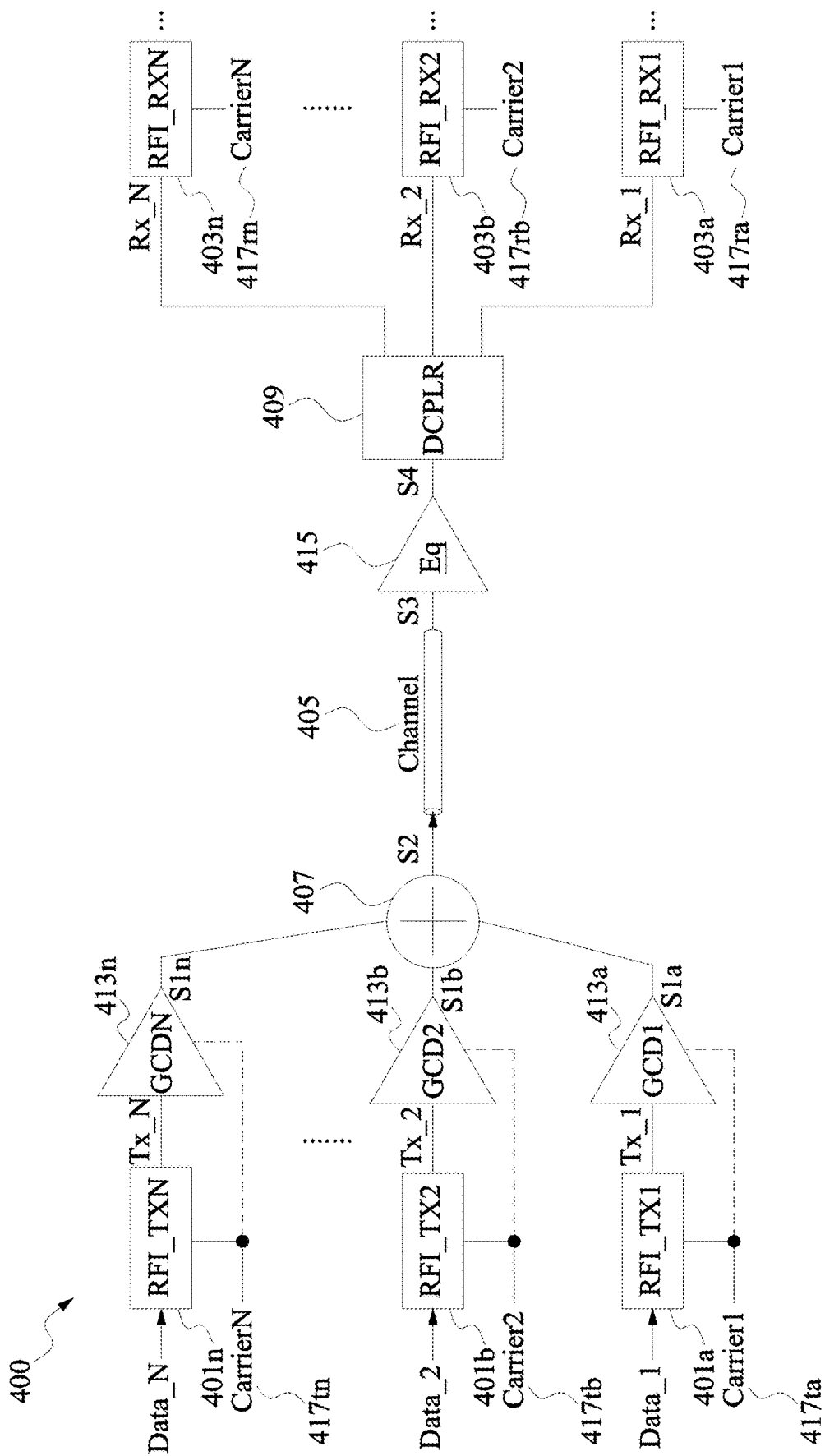
FIG. 4 is a block diagram of a radio frequency interconnect, in accordance with one or more embodiments.

FIG. 4 is a block diagram of an RFI 400, in accordance with one or more embodiments. RFI 400 comprises many of the features discussed with respect to RFI 100 (FIG. 1), with the reference numerals increased by 300. RFI 400 differs from RFI 100 in that RFI 400 includes a plurality of gain compensation drivers 413a-413n and one equalizer 415. As such, in RFI 400, the transmitter-side of transmission channel 405 is configured similar to the transmitter-side of RFI 200 (FIG. 2), and the receiver-side of the transmission channel 405 is configured like the receiver-side of RFI 100 (FIG. 1).

Figure 5:
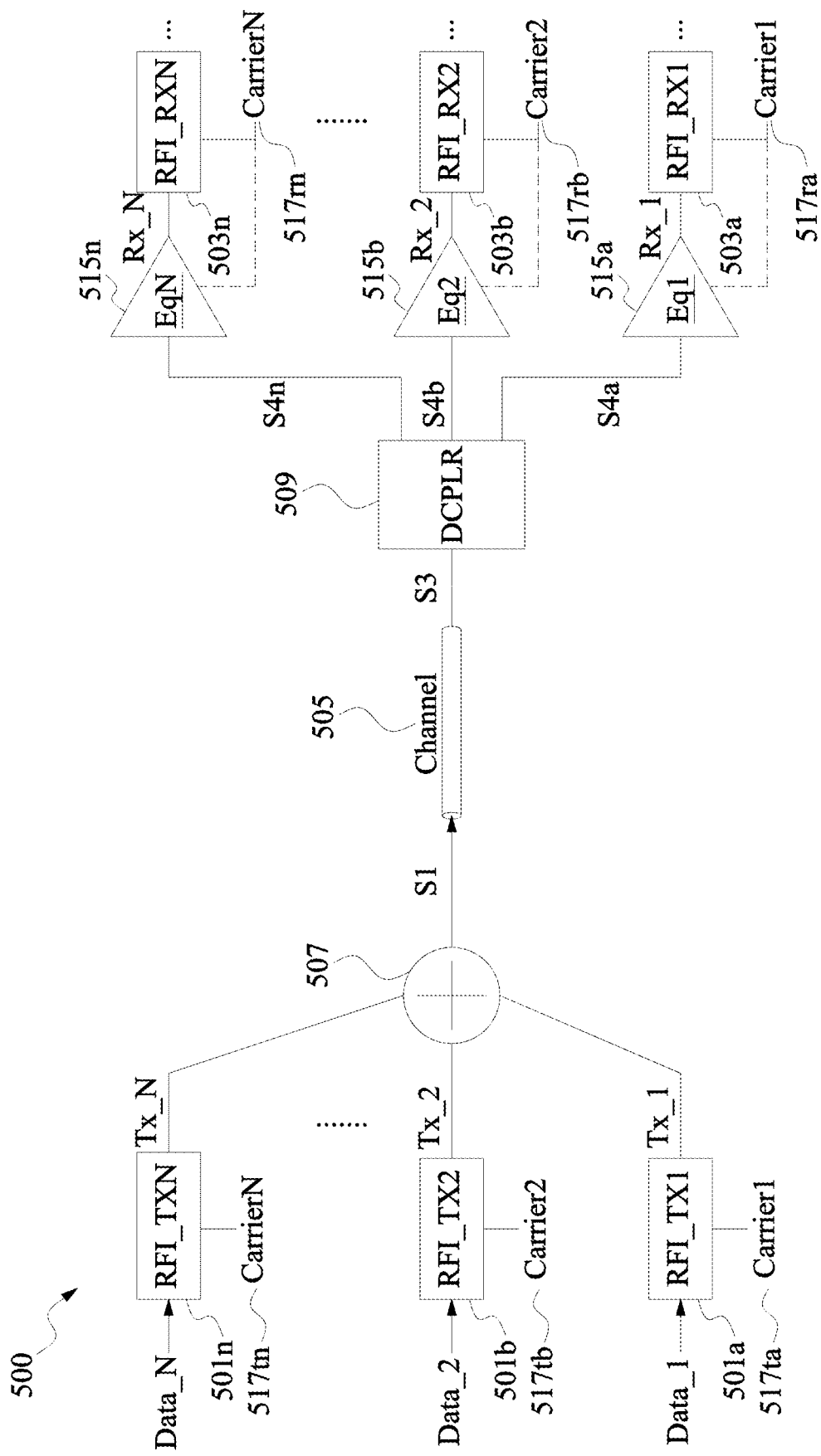
FIG. 5 is a block diagram of a radio frequency interconnect, in accordance with one or more embodiments.

FIG. 5 is a block diagram of an RFI 500, in accordance with one or more embodiments. RFI 500 comprises many of the features discussed with respect to RFI 100 (FIG. 1), with the reference numerals increased by 400. RFI 500 differs from RFI 100 in that RFI 500 is free from including gain compensation driver 113 (FIG. 1). RFI 500 includes a plurality of equalizers 515a-515n. Signal S1 is transmitted through transmission channel 505. Transmission channel 505 introduces channel loss to signal S1 and outputs signal S3. As such, in RFI 500, the transmitter-side of transmission channel 505 is configured similar to the transmitter-side of RFI 300 (FIG. 3), and the receiver-side of the transmission channel 505 is configured similar to the receiver-side of RFI 200 (FIG. 2).

Figure 6:
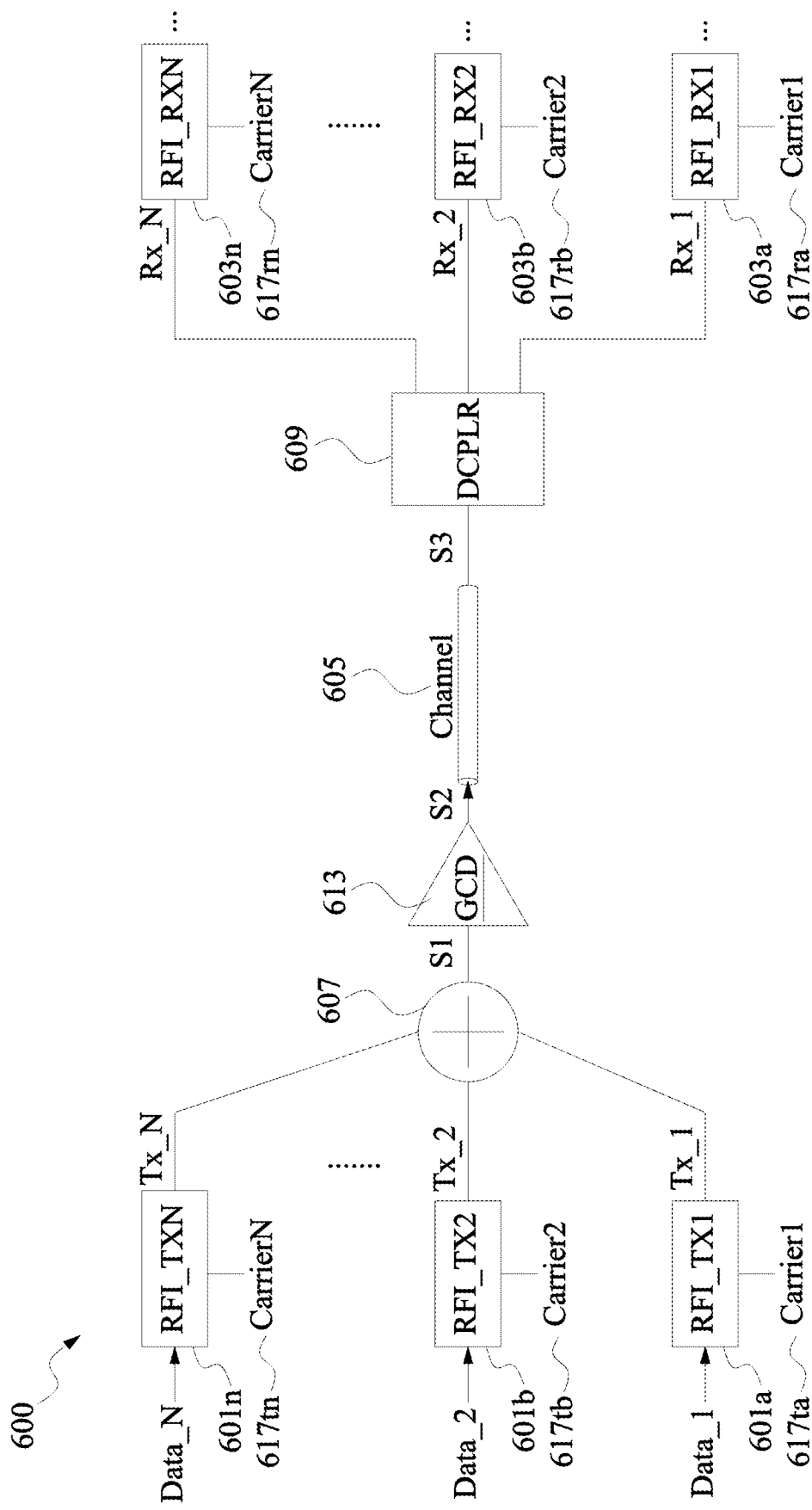
FIG. 6 is a block diagram of a radio frequency interconnect, in accordance with one or more embodiments.

FIG. 6 is a block diagram of an RFI 600, in accordance with one or more embodiments. RFI 600 comprises many of the features discussed with respect to RFI 100 (FIG. 1), with the reference numerals increased by 500. RFI 600 differs from RFI 100 in that RFI 600 is free from including equalizer 115 (FIG. 1). Signal S2 is transmitted through transmission channel 605. Coupler 609 receives signal S3 and is configured to divide signal S3 into received transmission signals Rx.

Figure 7:
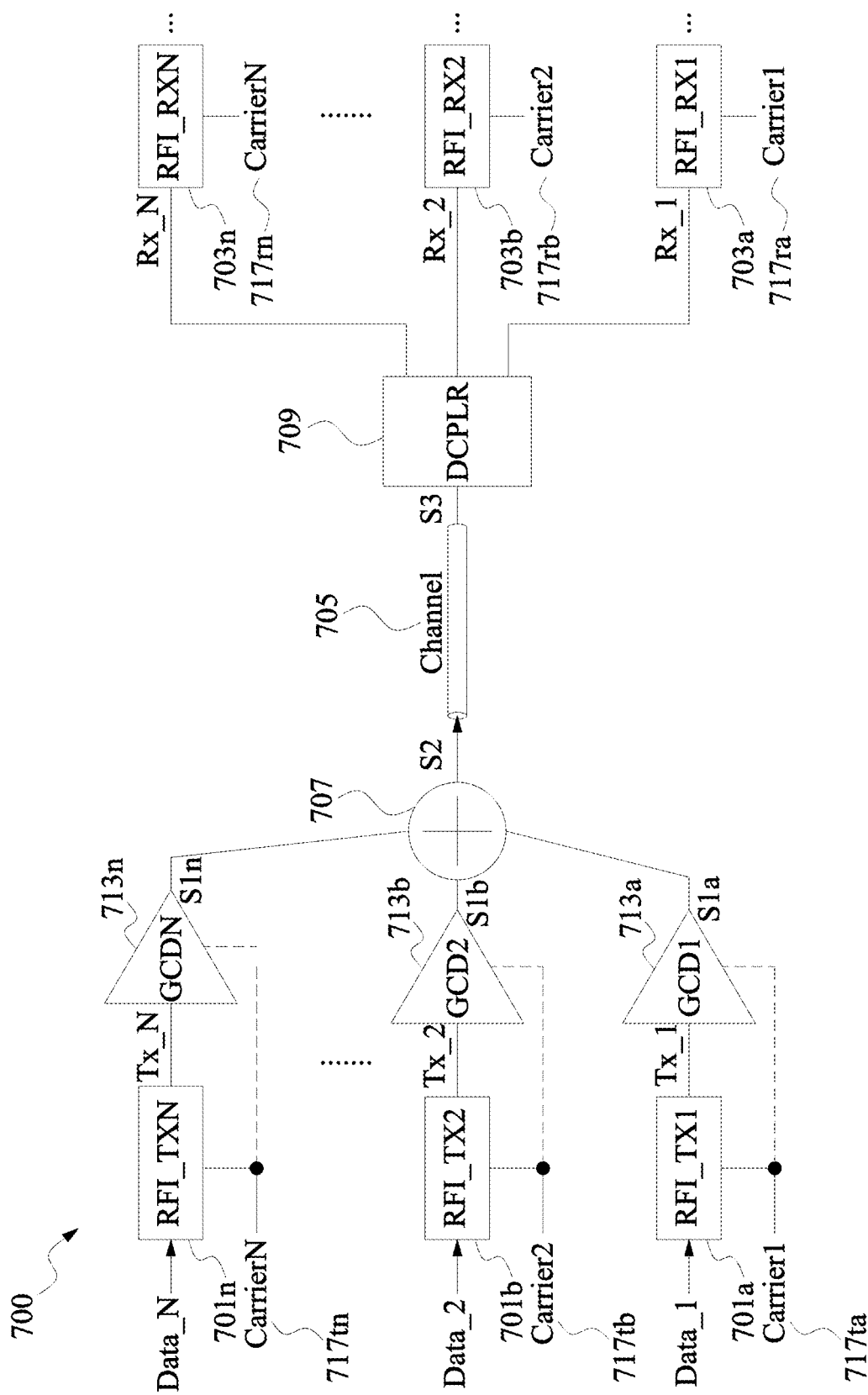
FIG. 7 is a block diagram of a radio frequency interconnect, in accordance with one or more embodiments.

FIG. 7 is a block diagram of an RFI 700, in accordance with one or more embodiments. RFI 700 comprises many of the features discussed with respect to RFI 100 (FIG. 1), with the reference numerals increased by 600. RFI 700 differs from RFI 100 in that RFI 700 includes a plurality of gain compensation drivers 713a-713n. RFI 700 is free from including equalizer 115 (FIG. 1). As such, in RFI 700, the transmitter-side of transmission channel 705 is configured similar to the transmitter-side of RFI 200 (FIG. 2), and the receiver-side of the transmission channel 705 is configured similar to the receiver-side of RFI 600 (FIG. 6).

Figure 8:
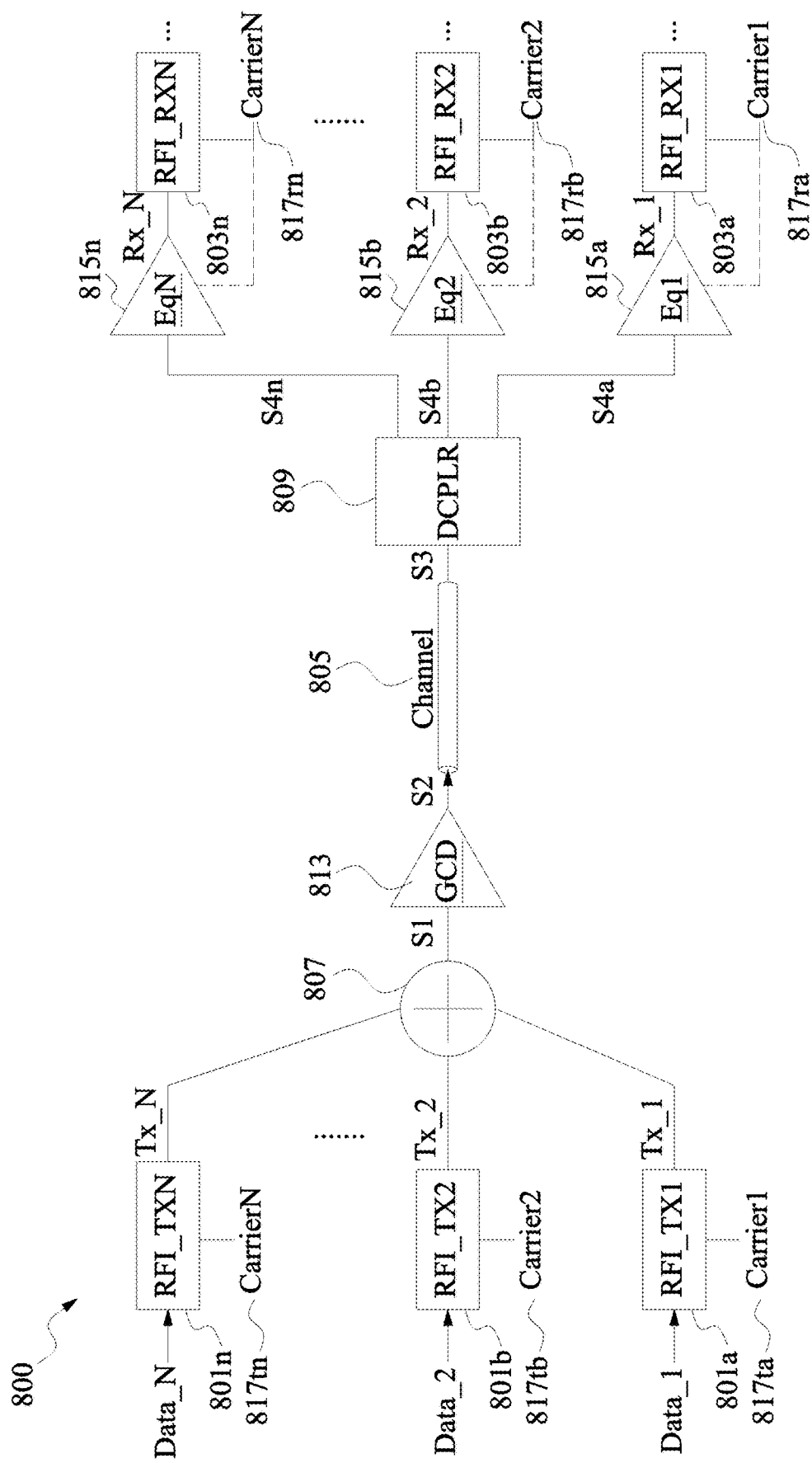
FIG. 8 is a block diagram of a radio frequency interconnect, in accordance with one or more embodiments.

FIG. 8 is a block diagram of an RFI 800, in accordance with one or more embodiments. RFI 800 comprises many of the features discussed with respect to RFI 100 (FIG. 1), with the reference numerals increased by 700. RFI 800 differs from RFI 100 in that RFI 800 includes one gain compensation driver 813 and a plurality of equalizers 815a-815n. As such, in RFI 800, the transmitter-side of transmission channel 805 is configured similar to the transmitter-side of RFI 100, and the receiver-side of the transmission channel 805 is configured similar to the receiver-side of RFI 200 (FIG. 2).

Figure 9:
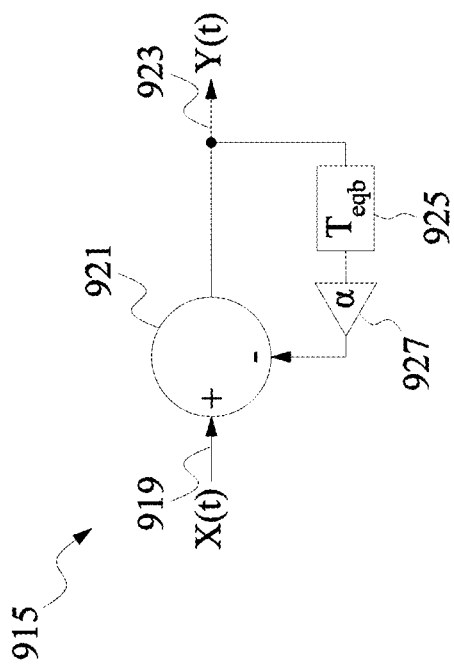
FIG. 9 is a block diagram of an equalizer, in accordance with one or more embodiments.

FIG. 9 is a block diagram of an equalizer 915, in accordance with one or more embodiments. Equalizer 915 is usable in place of any of the equalizers discussed herein. For example, in some embodiments, equalizer 915 is an example embodiment of equalizer 115 (FIG. 1). One of ordinary skill would recognize that the equalizers discussed herein are not limited to the configuration discussed with respect to equalizer 915.

Equalizer 915 comprises a signal input 919, an adder 921 coupled with the signal input, a signal output 923 coupled with the adder 921, a delay element 925 coupled with the signal output 923, and an amplifier 927 coupled with the delay element 925 and with the adder 921. Signal input 919 is configured to receive an input signal X(t). Input signal X(t) is representative of a signal received by an equalizer such as signal S3 (FIG. 1) or one of signals S4a-S4n (FIG. 2), for example. Signal output 923 is configured to output an output signal Y(t). Output signal Y(t) is representative of signal S4 (FIG. 1) or one of received transmission signals Rx_1-Rx_N (FIG. 2), in some embodiments. Delay element 925 is configured to receive the output signal Y(t), and delay the output signal Y(t) by delay factor $T_{eqb}$ to generate a delayed output signal. Amplifier 927 is configured to receive the delayed output signal, to amplify the delayed output signal by gain factor $\alpha_{eqd1}$, and to generate an amplified output signal. In some embodiments, amplifier 927 is a programmable gain amplifier having a selectable gain factor $\alpha_{eqd1}$. Adder 921 is configured to receive the input signal X(t), to receive the amplified output signal from amplifier 927, and to combine the input signal X(t) with the amplified output signal to generate output signal Y(t).

In some embodiments, delay element 925 is a delay locked loop that causes the output signal Y(t) to be delayed by delay factor $T_{eqb}$. In some embodiments, delay element 925 is a logic circuit configured to cause the output signal Y(t) to be delayed by delay factor $T_{eqb}$. In some embodiments, delay element 925 is a clock frequency doubler configured to cause the output signal Y(t) to be delayed by delay factor $T_{eqb}$. In some embodiments, delay factor $T_{eqb}$ delays output signal Y(t) by about half of the clock cycle of the output signal Y(t) to enable equalizer 915 to compensate for channel loss. As such, output signal Y(t) is about 180 degrees out of phase with input signal X(t). In some embodiments, delay factor $T_{eqb}$ delays the output signal Y(t) by a different amount to enable equalizer 915 to compensate for channel loss.

Figure 10:
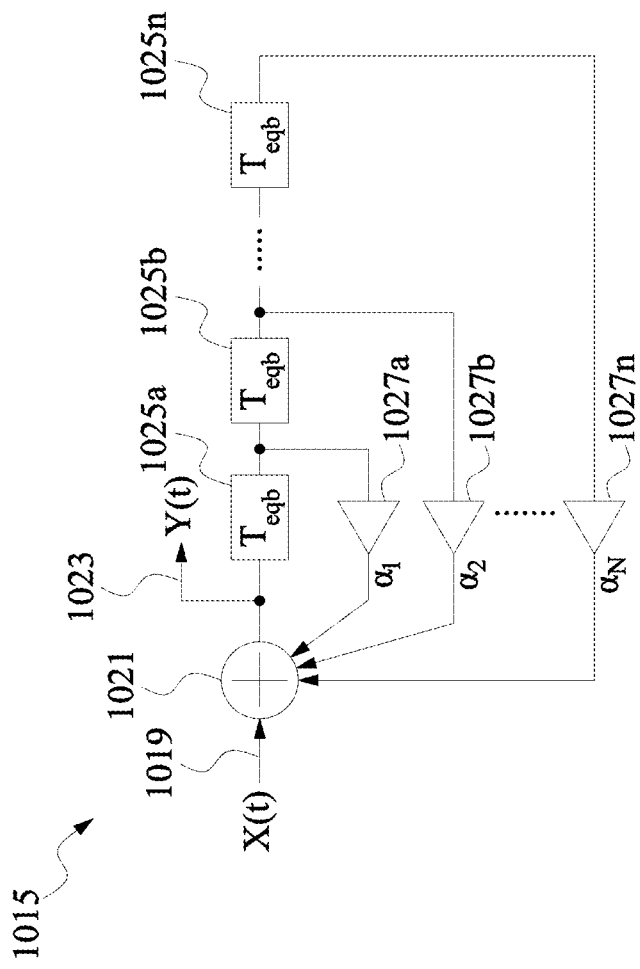
FIG. 10 is a block diagram of an equalizer, in accordance with one or more embodiments.

FIG. 10 is a block diagram of an equalizer 1015, in accordance with one or more embodiments. Equalizer 1015 is usable in place of any of the equalizers discussed herein.

For example, in some embodiments, equalizer 1015 is an example embodiment of equalizer 115 (FIG. 1). One of ordinary skill would recognize that the equalizers discussed herein are not limited the configuration discussed with respect to equalizer 1015.

Equalizer 1015 includes features similar to those discussed with respect to equalizer 915 (FIG. 9), with the reference numerals increased by 100. Equalizer 1015 differs from equalizer 915 in that equalizer 1015 is a multi-tap equalizer that comprises a plurality of delay elements 1025a-1025n (collectively referred to as delay elements 1025) coupled in series and a plurality of amplifiers 1027a-1027n (collectively referred to as amplifiers 1027) coupled between each delay element 1025 and the adder 1021. A first delay element 1025a is configured to receive the output signal Y(t) and to generate a first delayed output signal. Each subsequent delay element 1025 is configured to receive the first delayed output signal or a subsequent delayed output signal from a previous delay element 1025, and to generate a corresponding delayed output signal. The amplifiers 1027 are configured to amplify the first delayed output signal or corresponding subsequent output signals by respective gain factors $\alpha_1$-$\alpha_N$ to generate corresponding amplified output signals. Adder 1021 is configured to receive the input signal X(t), to receive the amplified output signals from amplifiers 1027, and to combine the input signal X(t) with the amplified output signals to generate the output signal Y(t).

In some embodiments, the amplifiers 1027 are programmable gain amplifiers with selectable gain factors $\alpha_1$-$\alpha_N$. In some embodiments, gain factors $\alpha_1$-$\alpha_N$ are equal to one another. In some embodiments, at least one of the gain factors $\alpha_1$-$\alpha_N$ is different from at least one of the other gain factors $\alpha_1$-$\alpha_N$.

Figures 11, 12:
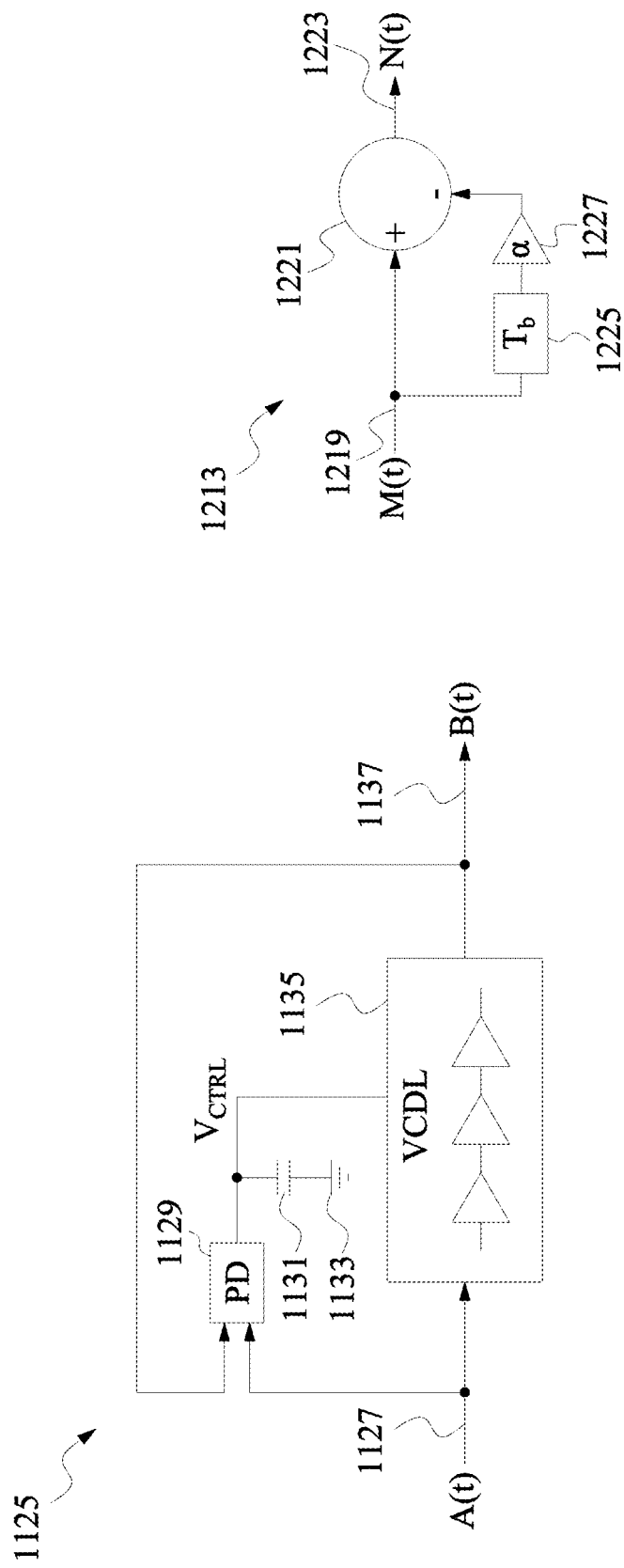
FIG. 11 is a block diagram of a delay element, in accordance with one or more embodiments.
FIG. 12 is a block diagram of a gain compensation driver, in accordance with one or more embodiments.

FIG. 11 is a block diagram of a delay element 1125, in accordance with one or more embodiments. Delay element 1125 is usable in place of any of the delay elements discussed herein. For example, in some embodiments, delay element 1125 is an example embodiment of delay element 925 (FIG. 9). One of ordinary skill would recognize that the delay elements discussed herein are not limited to the configuration discussed with respect to delay element 1125.

Delay element 1125 comprises a signal input 1127, a phase detector 1129 coupled with the signal input 1127, a capacitor 1131 coupled with the phase detector 1129 and a voltage node 1133 configured to carry a reference voltage, a voltage controlled delay line 1135 coupled with the signal input 1127 and the phase detector 1129, and a signal output 1137 coupled with the voltage delay line 1135 and with the phase detector 1129.

Signal input 1127 is configured to receive an input signal A(t). Input signal A(t) is representative of signal S4 (FIG. 1) or one of received transmission signals Rx_1-Rx_N (FIG. 2) output by the equalizers discussed herein. Output signal B(t) is representative of a delayed output signal generated by delay elements 925 or 1025, for example. The phase detector 1129 is configured to receive the output signal B(t) and the input signal A(t) and to compare the output signal B(t) with the input signal A(t). The phase detector 1129 is configured to determine a phase difference between the output signal B(t) and the input signal A(t). Based on the determined phase difference, the phase detector is configured to output a voltage control signal Vctrl. Based on the voltage control signal Vctrl, the voltage controlled delay line 1135 is configured to modify an amount the output signal B(t) is delayed compared to the input signal A(t). For example, if the delay factor $T_{eqb}$ is selected to delay the input signal A(t) by one half of the clock cycle of the input signal B(t), the phase detector 1129 outputs voltage control signal Vctrl to cause the voltage controlled delay line 1135 to delay the input signal A(t) by an amount that results in the output signal B(t) being 180 degrees out of phase with the input signal A(t).

FIG. 12 is a block diagram of a gain compensation driver 1213, in accordance with one or more embodiments. Gain compensation driver 1213 is usable in place of any of the gain compensation drivers discussed herein. For example, in some embodiments, gain compensation driver 1213 is an example embodiment of gain compensation driver 113 (FIG. 1). One of ordinary skill would recognize that the gain compensation drivers discussed herein are not limited to the configuration discussed with respect to gain compensation driver 1213.

Gain compensation driver 1213 comprises a signal input 1219, an adder 1221 coupled with the signal input 1219, a signal output 1223 coupled with the adder 1221, a delay element 1225 coupled with the signal output 1223, and an amplifier 1227 coupled with the delay element 1225 and with the adder 1221. Signal input 1219 is configured to receive an input signal M(t). Input signal M(t) is representative of a signal received by a gain compensation driver such as signal S1 (FIG. 1) or one of transmission Tx_1-Tx_N (FIG. 2), for example. Signal output 1223 is configured to output an output signal Y(t). Output signal N(t) is representative of signal S2 (FIG. 1) or one of signals S1-Sn (FIG. 2). Delay element 1225 is configured to receive the input signal M(t), and delay the input signal M(t) by delay factor $T_{gcdb}$ to generate a delayed output signal. Amplifier 1227 is configured to receive the delayed input signal, to amplify the delayed output signal by gain factor $\alpha_{gcd1}$, and to generate an amplified input signal. In some embodiments, amplifier 1227 is a programmable gain amplifier having a selectable gain factor $\alpha_{gcd1}$. Adder 1221 is configured to receive the input signal M(t), to receive the amplified input signal from amplifier 1227, and to combine the input signal M(t) with the amplified input signal to generate output signal N(t).

In some embodiments, delay element 1225 is a delay locked loop that causes the output signal N(t) to be delayed by delay factor $T_{gcdb}$. In some embodiments, delay element 1225 is logic circuit configured to cause the output signal N(t) to be delayed by delay factor $T_{gcdb}$. In some embodiments, delay element 1225 is a clock frequency doubler configured to cause the output signal N(t) to be delayed by delay factor $T_{gcdb}$. In some embodiments, delay factor $T_{gcdb}$ delays output signal N(t) by about half of the clock cycle of the output signal N(t) to enable gain compensation driver 1213 to compensate for channel loss. In some embodiments, delay factor $T_{gcdb}$ delays the output signal N(t) by a different amount to enable gain compensation driver 1213 to compensate for channel loss. In some embodiments, delay element 1225 comprises a phase detector and a voltage controlled delay line similar to delay element 1125 (FIG. 11).

Figure 13:
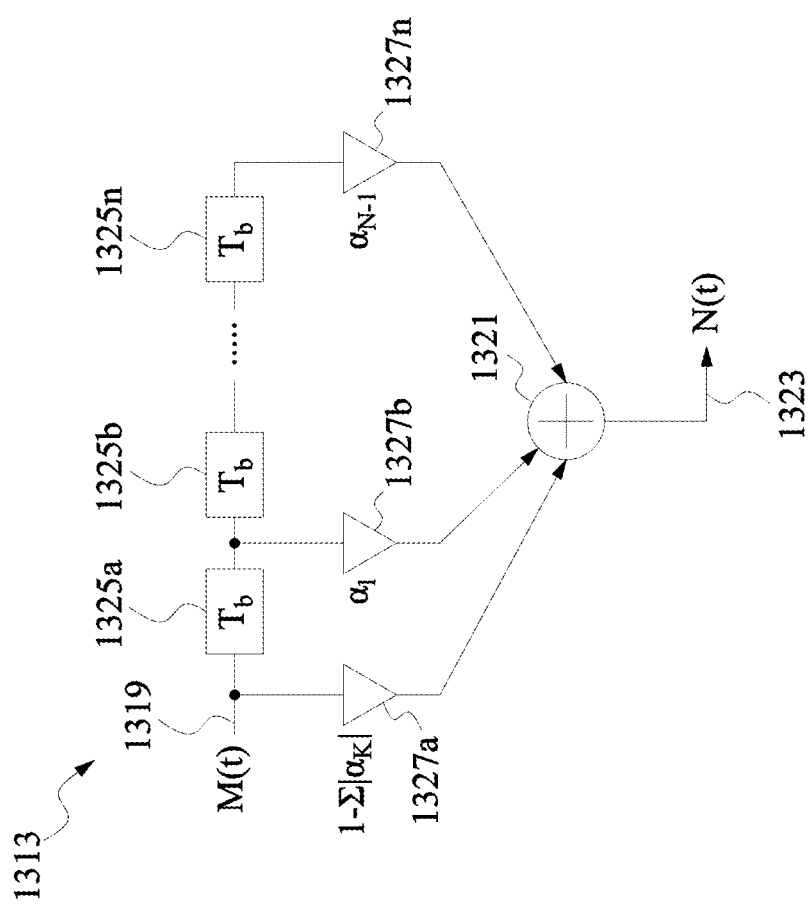
FIG. 13 is a block diagram of a gain compensation driver, in accordance with one or more embodiments.

FIG. 13 is a block diagram of a gain compensation driver 1313, in accordance with one or more embodiments. Gain compensation driver 1313 is usable in place of any of the gain compensation drivers discussed herein. For example, in some embodiments, gain compensation driver 1313 is an example embodiment of gain compensation driver 113 (FIG. 1). One of ordinary skill would recognize that the gain compensation drivers discussed herein are not limited to the configuration discussed with respect to gain compensation driver 1313.

Gain compensation driver 1313 includes features similar to those discussed with respect to gain compensation driver 1213 (FIG. 12), with the reference numerals increased by 100. Gain compensation driver 1313 differs from gain compensation driver 1213 in that gain compensation driver 1313 is a multi-tap gain compensation driver that comprises a plurality of delay elements 1325a-1325n (collectively referred to as delay elements 1325) coupled in series and a plurality of amplifiers 1327a-1327n (collectively referred to as amplifiers 1327) coupled between each delay element 1325 and the adder 1321. A first delay element 1325a is configured to receive the input signal M(t) and to generate a first delayed output signal. Each subsequent delay element 1325 is configured to receive the first delayed output signal or a subsequent delayed output signal from a previous delay element 1325, and to generate a corresponding delayed output signal. The amplifiers 1327 are configured to amplify the input signal M(t), the first delayed output signal, or corresponding subsequent output signals by respective gain factors $1-\Sigma|\alpha_K|$, $\alpha_1-\alpha_{N-1}$ to generate corresponding amplified input signals. Adder 1321 is configured to receive the amplified input signals from amplifiers 1327, and to combine the amplified input signals to generate the output signal N(t).

In some embodiments, the amplifiers 1327 are programmable gain amplifiers with selectable gain factors $1-\Sigma|\alpha_K|$, $\alpha_1-\alpha_{N-1}$ that are capable of being changed to modify the overall amount of gain added to or subtracted from input signal M(t). In some embodiments, gain factors $1-\Sigma|\alpha_K|$, $\alpha_1-\alpha_{N-1}$ are equal to one another. In some embodiments, at least one of the gain factors $1-\Sigma|\alpha_K|$, $\alpha_1-\alpha_{N-1}$ is different from at least one of the other gain factors $1-\Sigma|\alpha_K|$, $\alpha_1-\alpha_{N-1}$. In some embodiments, $\alpha_1-\alpha_{N-1}$ are less than zero. In some embodiments, $\alpha_1-\alpha_{N-1}$ are greater than zero.

Figure 14:
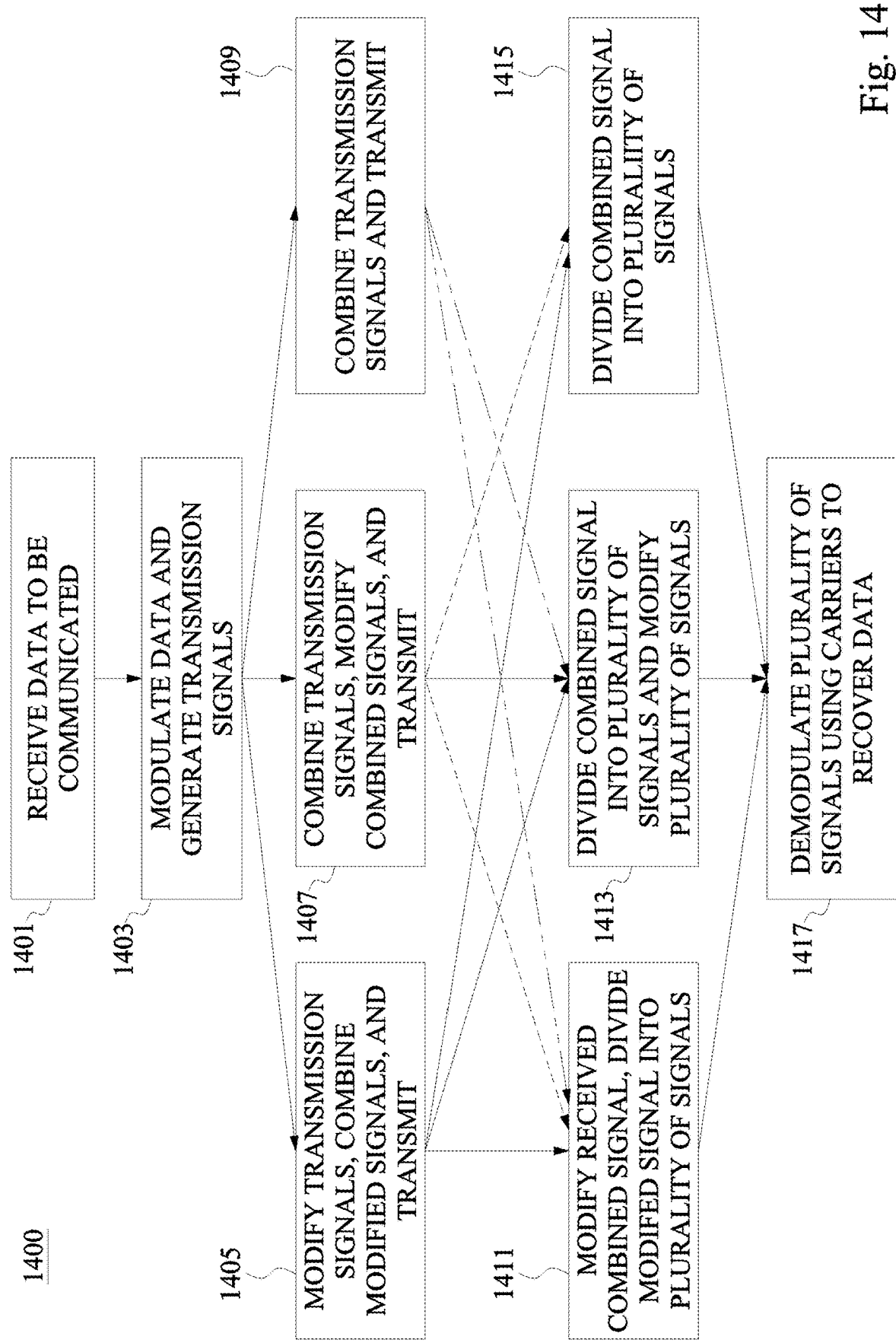
FIG. 14 is a flowchart of a method of transmitting and receiving data, in accordance with one or more embodiments

FIG. 14 is a flowchart of a method 1400 of transmitting and receiving data, in accordance with one or more embodiments. In some embodiments, method 1400 is implemented by a RFI such as one of RFI 100 through RFI 800 discussed with respect to FIGS. 1-8.

In operation 1401, a plurality of transmitters each receive data to be communicated to a plurality of receivers by way of a transmission channel. In step 1403, the transmitters of the plurality of transmitters modulate the received data using carriers associated with the transmitters to generate transmission signals.

Based on the configuration of the RFI used to implement method 1400, method 1400 proceeds to one of operation 1405, operation 1407, or operation 1409.

In operation 1405, the transmission signals are modified by respective gain compensation drivers to compensate for channel loss introduced by the transmission channel, the modified signals are combined by a combiner into a combined signal, and the combined signal is transmitted through the transmission channel.

In operation 1407, the transmission signals are combined into a combined signal by a combiner, the combined signal is modified by a gain compensation driver, and the modified combined signal is transmitted through the transmission channel.

In operation 1409, the transmission signals are combined into a combined signal by a combiner, and the combined signal is transmitted through the transmission channel.

Based on the configuration of the RFI used to implement method 1400, method 1400 proceeds to one of operation 1411, operation 1413, or operation 1415.

Because the RFIs used to implement method 1400 include at least one gain compensation driver or at least one equalizer, method 1400 only proceeds to operation 1415 by way of operation 1405 or operation 1407.

In operation 1411, the combined signal transmitted through the transmission channel is received by an equalizer, modified by the equalizer to compensate for channel loss, and the combined signal modified by the equalizer is divided into a plurality of received transmission signals.

In operation 1413, the combined signal transmitted through the transmission channel is received by a decoupler, divided into a plurality of signals, the plurality of signals are individually received by equalizers of a plurality of equalizers, the equalizers of the plurality of equalizers modify the divided signals to compensate for channel loss and output a plurality of received transmission signals.

In operation 1415, the combined signal transmitted through the transmission channel is received by a decoupler and divided into a plurality of received transmission signals.

In operation 1417, the received transmission signals are demodulated by respective receivers of the plurality of receivers that correspond to the transmitters of the plurality of transmitters using carriers that correspond to the carriers used to modulate the data to be transmitted. Demodulating the received transmission signals results in data that is readable by the receivers or another device coupled with the receivers.

In some embodiments, a receiver circuit includes a plurality of receivers, each receiver of the plurality of receivers being associated with a carrier of a plurality of carriers, a decoupler configured to receive a transmission signal from a transmission channel and output a plurality of divided transmission signals to the plurality of receivers, and an equalizer configured to modify one of the transmission signal or a divided transmission signal of the plurality of divided transmission signals.

In some embodiments, a receiver circuit includes a decoupler configured to receive a transmission signal from a transmission channel, divide the transmission signal into a plurality of divided transmission signals, each divided transmission signal of the plurality of divided transmission signals corresponding to a carrier frequency, and output the plurality of divided transmission signals. A receiver is configured to receive a divided transmission signal of the plurality of divided transmission signals, and an equalizer is configured to cause the divided transmission signal of the plurality of divided transmission signals received by the receiver to be modified.

In some embodiments, a receiver circuit includes a decoupler configured to receive a transmission signal from a transmission channel, divide the transmission signal into a plurality of divided transmission signals, each divided transmission signal of the plurality of divided transmission signals corresponding to a carrier frequency, and output the plurality of divided transmission signals to a corresponding plurality of receivers. An equalizer is configured to cause the plurality of divided transmission signals received by the plurality of receivers to be modified.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A receiver circuit, comprising:
a plurality of receivers, each receiver of the plurality of receivers being associated with a carrier of a plurality of carriers;
a decoupler configured to receive a transmission signal from a transmission channel and output a plurality of divided transmission signals to the plurality of receivers; and
an equalizer configured to modify one of the transmission signal or a divided transmission signal of the plurality of divided transmission signals,
wherein the equalizer modification is based on a frequency-dependent loss of the transmission signal introduced by the transmission channel.

2. The receiver circuit of claim 1, wherein
the equalizer is one equalizer of a plurality of equalizers, and
each equalizer of the plurality of equalizers is configured to modify a corresponding divided transmission signal of the plurality of divided transmission signals.

3. The receiver circuit of claim 2, wherein each equalizer of the plurality of equalizers is configured to
receive a corresponding carrier of the plurality of carriers, and
modify the corresponding divided transmission signal of the plurality of divided transmission signals by applying a gain factor based on the corresponding carrier of the plurality of carriers.

4. The receiver circuit of claim 2, wherein each equalizer of the plurality of equalizers is configured to
receive a corresponding carrier of the plurality of carriers, and
modify the corresponding divided transmission signal of the plurality of divided transmission signals by applying a delay based on the corresponding carrier of the plurality of carriers.

5. The receiver circuit of claim 1, wherein the equalizer is configured to apply a gain factor to the one of the transmission signal or the divided transmission signal of the plurality of divided transmission signals based on an estimated value of the frequency-dependent loss of the transmission channel.

6. The receiver circuit of claim 1, wherein the equalizer is configured to modify the one of the transmission signal or the divided transmission signal of the plurality of divided transmission signals based on a predefined signal-to-noise ratio threshold of the one of the transmission signal or the divided transmission signal of the plurality of divided transmission signals.

7. The receiver circuit of claim 1, wherein the equalizer is configured to modify the transmission signal by being coupled between the transmission channel and the decoupler.

8. A receiver circuit, comprising:
a decoupler configured to
receive a transmission signal from a transmission channel,
divide the transmission signal into a plurality of divided transmission signals, each divided transmission signal of the plurality of divided transmission signals corresponding to a carrier frequency, and
output the plurality of divided transmission signals;
a receiver configured to receive a divided transmission signal of the plurality of divided transmission signals; and an equalizer configured to cause the divided transmission signal of the plurality of divided transmission signals received by the receiver to be modified,
wherein the equalizer modification is based on a frequency-dependent loss of the transmission signal introduced by the transmission channel.

9. The receiver circuit of claim 8, wherein the equalizer is configured to modify one of the transmission signal or the divided transmission signal of the plurality of divided transmission signals by compensating for a frequency-dependent loss of the transmission signal introduced by the transmission channel.

10. The receiver circuit of claim 8, wherein the equalizer is configured to
receive one of the transmission signal or the divided transmission signal of the plurality of divided transmission signals as an input signal,
delay the input signal by a delay factor,
amplify the delayed input signal by a gain factor,
add the amplified delayed signal to the input signal to generate an output signal, and
provide the output signal as a corresponding one of a modified transmission signal or a modified divided transmission signal of the plurality of divided transmission signals.

11. The receiver circuit of claim 8, wherein the equalizer comprises:
a signal input configured to receive an input signal;
a signal output configured to output an output signal;
an adder coupled between the signal input and the signal output; and
a delay element and an amplifier coupled in series between the signal output and the adder.

12. The receiver circuit of claim 11, wherein
the delay element is one delay element of a plurality of delay elements coupled between the signal output and the adder, and
the amplifier is one amplifier of a plurality of amplifiers coupled between the signal output and the adder.

13. The receiver circuit of claim 12, wherein
each amplifier of the plurality of amplifiers has a gain factor, and
at least one gain factor of an amplifier of the plurality of amplifiers is different from one other gain factor of another amplifier of the plurality of amplifiers.

14. The receiver circuit of claim 11, wherein the amplifier has a programmable gain factor.

15. The receiver circuit of claim 11, wherein the delay element is configured to delay the output signal by a delay factor configured to cause the output signal to be about 180 degrees out of phase with the input signal.

16. A receiver circuit, comprising:
a decoupler configured to
receive a transmission signal from a transmission channel,
divide the transmission signal into a plurality of divided transmission signals, each divided transmission signal of the plurality of divided transmission signals corresponding to a carrier frequency, and
output the plurality of divided transmission signals to a corresponding plurality of receivers; and
an equalizer configured to cause the plurality of divided transmission signals received by the plurality of receivers to be modified,
wherein the equalizer modification is based on a frequency-dependent loss of the transmission signal introduced by the transmission channel.

17. The receiver circuit of claim 16, wherein
the equalizer is one equalizer of a plurality of equalizers,
each equalizer of the plurality of equalizers is coupled between the decoupler and a corresponding receiver of the plurality of receivers.

18. The receiver circuit of claim 17, wherein each equalizer of the plurality of equalizers is configured to
receive a corresponding divided transmission signal of the plurality of divided transmission signals as an input signal,
delay the input signal by a delay factor,
amplify the delayed input signal by a gain factor,
add the amplified delayed signal to the input signal to generate an output signal, and
provide the output signal as a corresponding modified divided transmission signal of the plurality of divided transmission signals.

19. The receiver circuit of claim 18, wherein each equalizer of the plurality of equalizers is further configured to
receive a carrier signal having the carrier frequency of the corresponding divided transmission signal of the plurality of divided transmission signals, and
at least one of delay the input signal by the delay factor or amplify the delayed input signal by the gain factor based on the carrier frequency.

20. The receiver circuit of claim 18, wherein at least one of the delay factor or gain factor has a value corresponding to an estimated value of the frequency-dependent loss compensation level based on the carrier frequency.

* * * * *